United States Patent
Wang et al.

(10) Patent No.: US 6,479,321 B2
(45) Date of Patent: Nov. 12, 2002

(54) ONE-STEP SEMICONDUCTOR STACK PACKAGING METHOD

(75) Inventors: Hsing-Seng Wang, Hsinchu (TW); Rong-Shen Lee, Chupei (TW)

(73) Assignee: Industrial Technology Research Institute, Hsinchu (TW)

(*) Notice: Subject to any disclaimer, the term of this patent is extended or adjusted under 35 U.S.C. 154(b) by 0 days.

(21) Appl. No.: 09/814,930

(22) Filed: Mar. 23, 2001

(65) Prior Publication Data

US 2002/0137255 A1 Sep. 26, 2002

(51) Int. Cl.[7] .................... H01L 21/44; H01L 21/48; H01L 21/50
(52) U.S. Cl. ................ 438/109; 438/107; 438/108; 438/613; 228/180.21; 228/180.22
(58) Field of Search ................ 438/107–109, 438/613; 228/180.21, 180.22

(56) References Cited

U.S. PATENT DOCUMENTS

| | | | |
|---|---|---|---|
| 4,830,264 A | * 5/1989 | Bitaillou et al. | 228/180.2 |
| 5,222,014 A | 6/1993 | Lin | |
| 5,262,351 A | * 11/1993 | Bureau et al. | 437/183 |
| 5,722,160 A | * 3/1998 | Uemura et al. | 29/840 |
| 5,811,877 A | 9/1998 | Miyano et al. | |
| 6,287,892 B1 | * 9/2001 | Takahashi et al. | 438/107 |

OTHER PUBLICATIONS

Lau, Flip Chip Technologies, McGraw–Hill, 1996, pp. 186–187.*

* cited by examiner

Primary Examiner—David L. Talbott
Assistant Examiner—David A. Zarneke
(74) Attorney, Agent, or Firm—Rabin & Berdo, P.C.

(57) ABSTRACT

The present invention discloses a method that applies one time of reflow after stacking a plurality of semiconductor elements to complete the packaging. The upper surface of the chip carrier substrate (opposite side to the chip) in a semiconductor packaging element is implanted with solder balls or coated with solder paste. After stacking a plurality of the semiconductor packaging elements together, a reflow is applied to achieve electrical and physical connections among substrates. If the semiconductor packaging elements are ultra-thin elements, then one only needs to implant solder balls or coat solder paste on the substrate top surface of the top semiconductor packaging element and the substrate bottom surface of the bottom semiconductor packaging element. The reflow will make the soldering material permeate through each layer of substrate, completing the electrical connection between substrates. This type of one-step stack packaging can simultaneously satisfy the requirements of high packaging densities, simple manufacturing processes and low costs.

46 Claims, 10 Drawing Sheets

ONE-STEP SEMICONDUCTOR STACK PACKAGING METHOD

BACKGROUND OF THE INVENTION

1. Field of Invention

The present invention relates to a semiconductor packaging method and, in particular, to a one-step semiconductor stack packaging method.

2. Related Art

As electronic products become lighter, thinner, shorter and smaller, semiconductor packaging methods are also developed toward high densities and multi-functions. Small sizes but more capabilities have become the basic requirements for electronic products and semiconductor packaging. How to increase the semiconductor packaging density so as to promote the capabilities of the packaging elements while at the same time to decrease the complexity and cost in manufacturing has long been the target that semiconductor packaging industries are after. Stack type semiconductor packaging places elements or chips in a pile and thus is able to provide a higher packaging density and more functions than conventional planar packaging methods. A conventional technique for semiconductor stack packaging, such as the lead frame type stack packaging disclosed in the U.S. Pat. No. 5,811,877, packages chips in an ultra-thin lead frame and molds it into a thinner packaging device. Such devices are then stacked together and the pins of the lead frames are electrically connected. The manufacturing process is simple and has been widely used in semiconductor stack packaging. However, there are still some drawbacks that limit its development. For example, the packaging using lead frames is limited in its finite thickness and cannot be made to extremely thin. Furthermore, the electrical connections among stack devices can only achieved through the pins of the lead frames. The U.S. Pat. No. 5,222,014 also discloses a semiconductor stack packaging method, which needs to grow solder bumps on the top and bottom surfaces of a lower chip carrier substrate and solder bumps on the bottom surface of an upper chip carrier substrate. After the two chip carrier substrates are then aligned and stacked together, a reflow step is performed to achieve the electrical and mechanical connections between the two substrates. Since this method has to grow solder bumps on the top and bottom surfaces of all the chip carrier substrates except for the top one, the manufacturing process is much more complicated.

Therefore, it is highly desirable to provide a new semiconductor stack packaging method to improve existing technologies.

SUMMARY OF THE INVENTION

Accordingly, it is an objective of the invention to provide a one-step semiconductor stack packaging method to increase semiconductor packaging densities and to lower the complexity and cost of manufacturing.

Pursuant to the above objective, the present invention uses a one-step packaging method to stack and package a plurality of semiconductor packaging elements. According to a preferred embodiment of the invention, the top surface of each chip carrier substrate (opposite side to the chip) in the semiconductor packaging element is implanted with solder balls or applied with solder paste. After the plurality of semiconductor packaging elements are aligned and stacked, a reflow is applied to achieve electrical and physical connections among all substrates. This type of one-step stack packaging can simultaneously satisfy the requirements of high packaging densities, simple manufacturing processes and low costs.

The above semiconductor packaging elements can be the same or different semiconductor elements or semiconductor elements packaged in the same or different ways. A proper wiring and layout of I/O pads of the substrate can be prepared in advance according to the practical situation, rendering versatile applications.

In accordance with the invention, the disclosed one-step stack packaging method includes the following steps: prepare several semiconductor packaging elements, each of which is composed of a substrate and at least one chip with the substrate having an upper surface and a lower surface, the chip being installed on the lower surface of the substrate, and the substrate has been finished in a layout of wiring and proper I/O pads in advance; coat a soldering flux on the I/O pads on the upper surface of the substrate; dispose solder balls on the upper surface of the substrate; align and stack the semiconductor packaging elements; and reflow the stacked semiconductor packaging elements to complete the electrical connections among the substrates.

The steps of coating a soldering flux and disposing solder balls on the I/O pads can be replaced with coating tin gel by printing.

The I/O pads may or may not have via holes. The via holes can be filled with some filling material. The substrate can be a single-layer board, a multi-layer board, a flexible substrate or a rigid substrate.

In the above method, the semiconductor packaging element can be refined into ultra-thin elements. If the I/O pads of the substrate has via holes, one only needs to implant solder balls or apply solder paste on the I/O pad on the substrate top surface of the top semiconductor packaging element and the I/O pad on the substrate bottom surface of the bottom semiconductor packaging element. The reflow step can make the soldering material permeate through all layers of substrates, achieving electrical connections among the substrates.

Other features and advantages of the present invention will be apparent from the following detailed description, which proceeds with reference to the accompanying drawings.

BRIEF DESCRIPTION OF THE DRAWINGS

The present invention will become more fully understood from the detailed description given hereinbelow illustration only, and thus are not limitative of the present invention, and wherein.

In the various drawings, the same references relate to the same elements.

DETAILED DESCRIPTION OF THE INVENTION

Figure 1A:
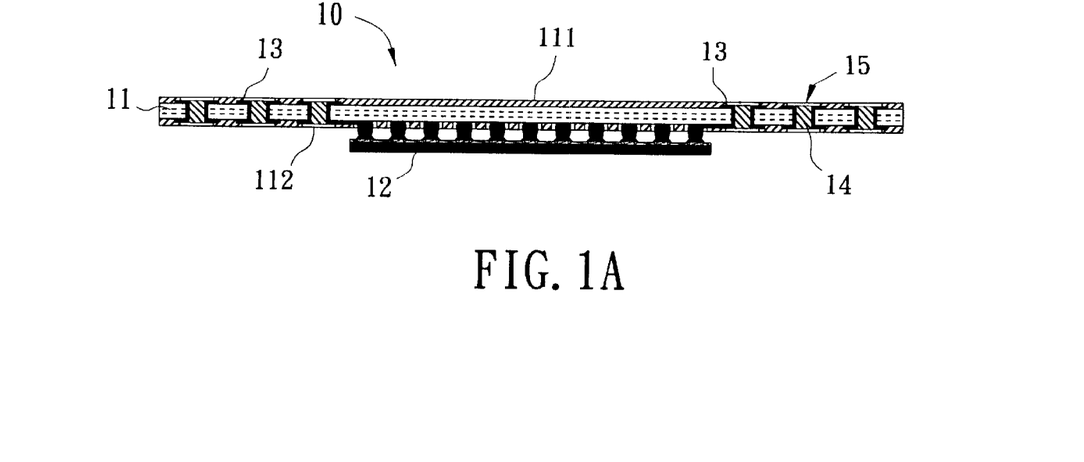
FIGS 1A through 1E the flowcharts in accordance with a first embodiment of the disclose one-step semiconductor stack packaging method.

A preferred embodiment of the disclosed one-step semiconductor stack packaging method starts by providing several semiconductor packaging elements 10. The semiconductor packaging element 10, as shown in FIG. 1A, can be a ball grid array (BGA) element packaged by flip-chip bonding method. Each of the semiconductor packaging elements 10 includes a substrate 11 and at least one chip 12. The substrate 11 supports the chip. It has an upper surface 111 and a lower surface 112. The chip 12 is installed on the lower surface 112 by flip-chip bonding method. The substrate 11 can be a single-layer board, a multi-layer board, a rigid substrate, or a flexible substrate. A layout of wires and I/O pads is prepared in advance on the substrate 11. The I/O pad 13 can have via holes 15 filled with a filling material 14.

Figure 1B:
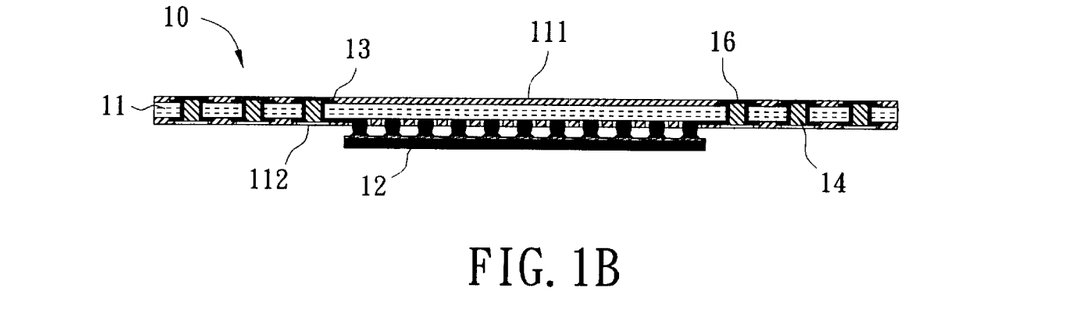
Figure 1C:
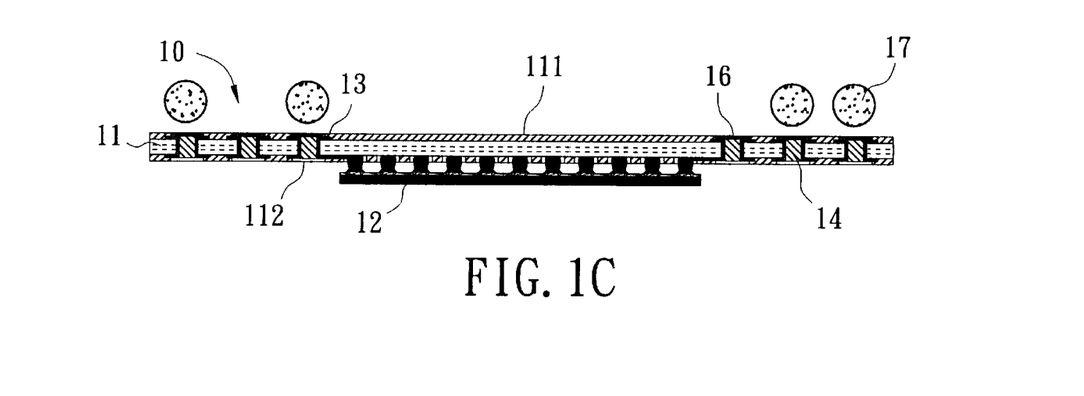
Figure 1D:
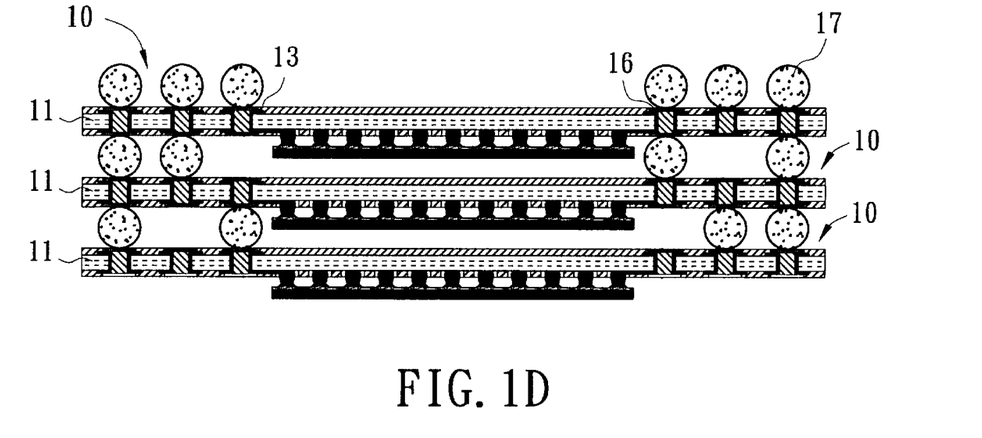
Figure 1E:
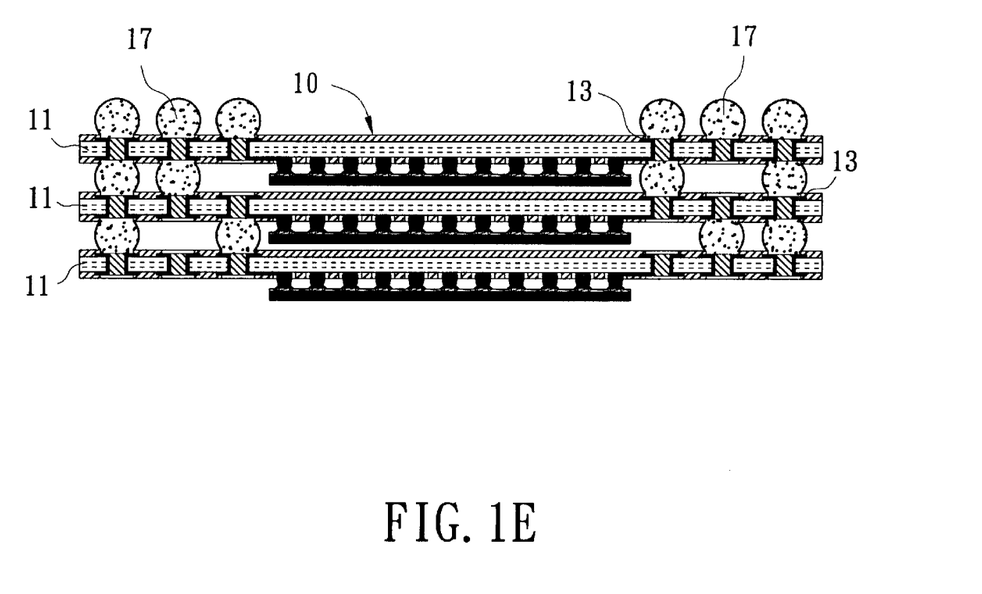

As shown in FIG. 1B, each of the I/O pads 13 on the upper surface 11 of the substrate 11 is coated with a soldering flux 16. Then, as shown in FIG. 1C, the appropriate I/O pads 13 on the top surface 111 of the substrate 11 are disposed with solder balls 17, which can be composed of tin or tin alloy. Afterwards, as shown in FIG. 1D, the semiconductor packaging elements 10 finished with coating the soldering flux 16 and disposing the solder balls 17 are aligned and stacked together. Then, as shown in FIG. 1E, a reflow procedure is applied to the stacked semiconductor packaging elements 10 so that the solder balls 17 are melted and bind the I/O pads 13 on adjacent substrates together, achieving the electrical and physical connections among all the substrates 11.

As shown in FIGS. 2A through 2E, the second embodiment of the invention is basically similar to the previous one. The only difference is in that the via holes of the I/O pads are not filled with any filling material.

Figure 2A:
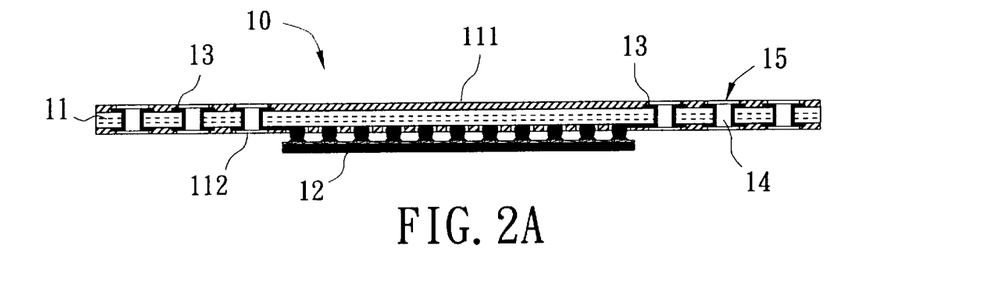
FIGS. 2A through 2E are the flowcharts in accordance with a second embodiment of the disclosed one step semiconductor stack packaging method.

First, several semiconductor packaging elements 10 are provided. The semiconductor packaging element 10, as shown in FIG. 2A, can be a BGA element packaged by flip-chip bonding method. Each of the semiconductor packaging elements 10 includes a substrate 11 and at least one chip 12. The substrate supports the chip. It has an upper surface 111 and a lower surface 112. The chip 12 is installed on the lower surface 112 by flip-chip bonding method. The substrate 11 can be a single-layer board, a multi-layer board, a rigid substrate, or a flexible substrate. A layout of wires and I/O pads is prepared in advance on the substrate 11. The I/O pad 13 can have via holes 15 penetrating through the substrate 11.

Figure 2B:
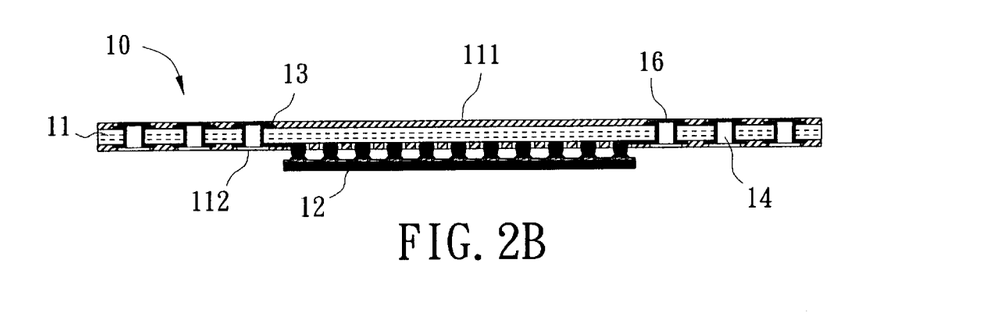
Figure 2C:
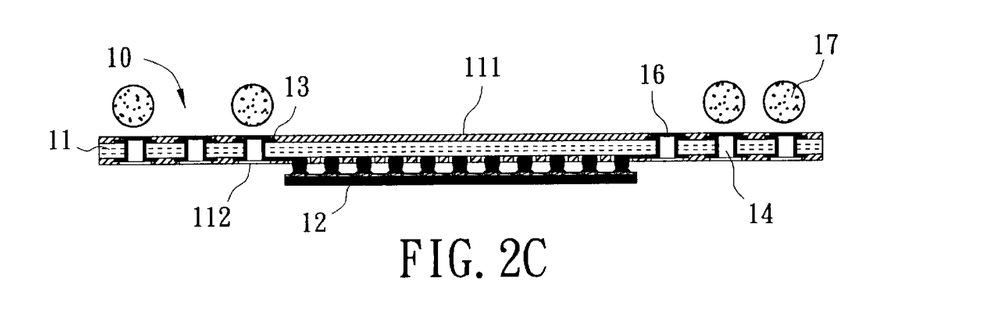
Figure 2D:
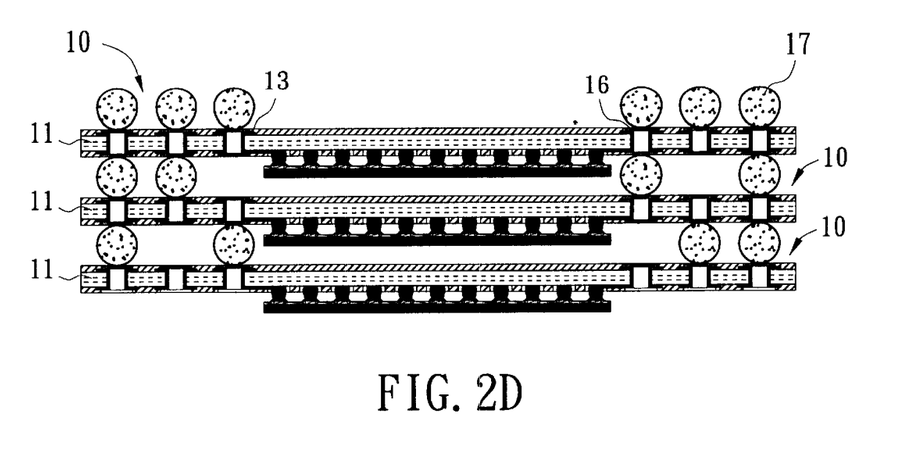
Figure 2E:
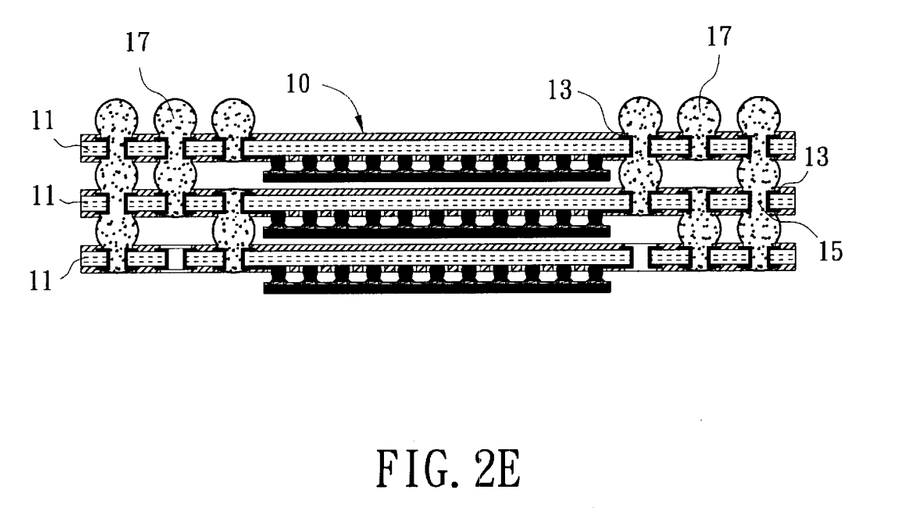

As shown in FIG. 2B, each of the I/O pads 13 on the upper surface 11 of the substrate 11 is coated with a soldering flux 16. Then, as shown in FIG. 2C, the appropriate I/O pads 13 on the top surface 111 of the substrate 11 are disposed with solder balls 17, which can be composed of tin or tin alloy. Afterwards, as shown in FIG. 2D, the semiconductor packaging elements 10 finished with coating the soldering flux 16 and disposing the solder balls 17 are aligned and stacked together. Then, as shown in FIG. 2E, a reflow procedure is applied to the stacked semiconductor packaging elements 10 so that the solder balls 17 are melted and bind the I/O pads 13 on adjacent substrates together, achieving the electrical and physical connections among all the substrates 11. The melted soldering material is conducted to fill in the via holes 15 of the I/O pads on adjacent substrates.

Figure 3A:
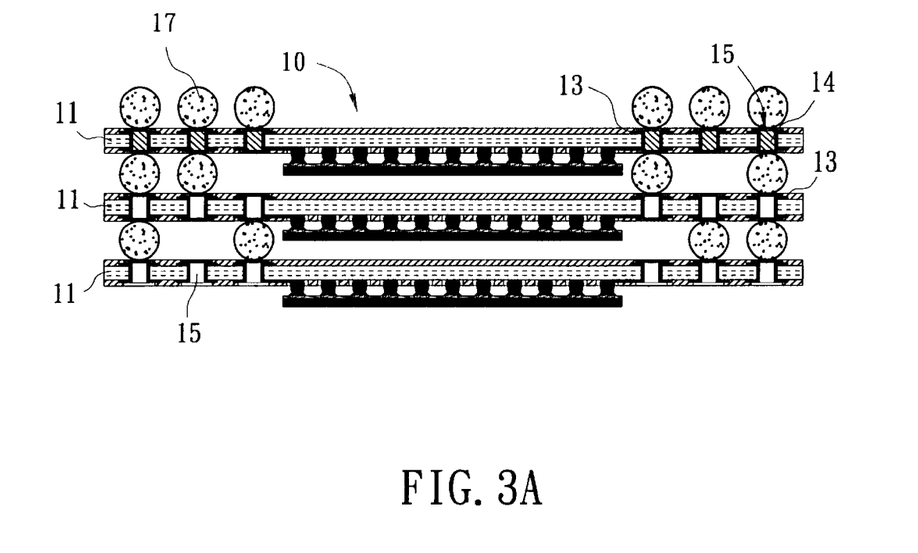
FIGS 3A through 3B show a third embodiment of the disclosed one-step semiconductor stack aging method.
Figure 3B:
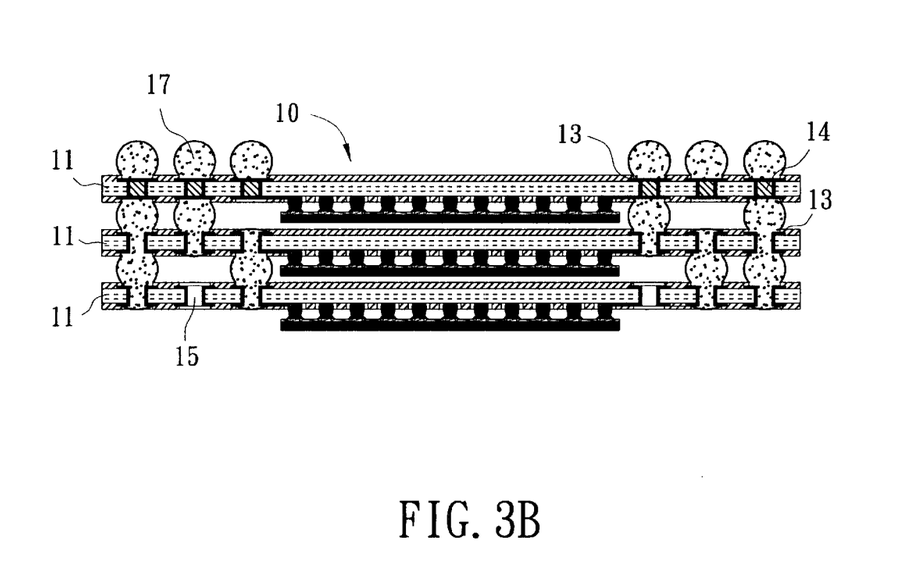

Please refer to FIGS. 3A and 3B for the third embodiment of the invention. As shown in FIG. 3A, only the via holes 15 on the substrate 11 of the top semiconductor packaging element is filled with a filling material 14; the via holes 15 on other substrates 11 are open. The reason to do so is because after the reflow process, the height of the solder balls 17 on the top substrate 11 among the stacked semiconductor packaging elements 10 becomes more homogeneous, as shown in FIG. 3B.

Figure 4A:
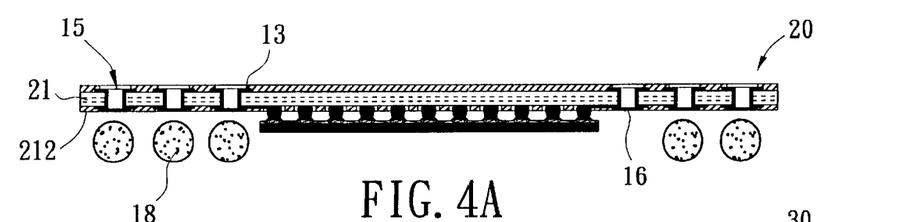
FIGS. 4A through 4D show a fourth embodiment of the disclosed one-step semiconductor stack packaging method.
Figure 4B:
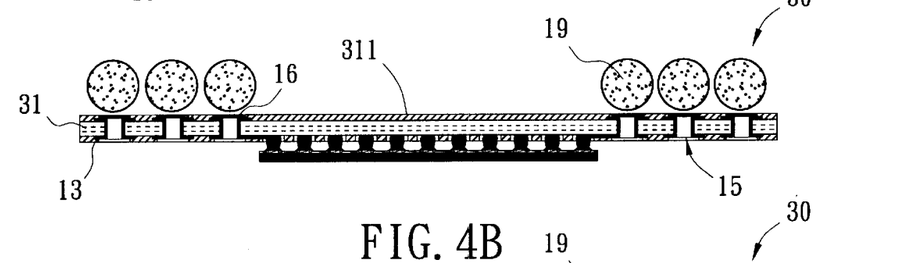

With reference to FIGS. 4A through 4D, the semiconductor packaging elements are preferably ultra-thin elements and the I/O pads on the substrates of such ultra-thin semiconductor packaging elements have via holes 15. As shown in FIG. 4A, the I/O pads 13 on the bottom surface 212 of the substrate 21 of the bottom semiconductor packaging element 20 are first coated with a soldering flux 16. The appropriate I/O pads 13 on the bottom surface 212 of the bottom substrate 21 are disposed with solder balls 18. As shown in FIG. 4B, the I/O pads 13 on the top surface 311 of the substrate 31 of the top semiconductor packaging element 30 are coated with a soldering flux 16. The appropriate I/O pads 13 on the top surface 311 of the top substrate 31 are disposed with solder balls 19. The solder balls 19 on the top substrate 31 are relatively larger than the solder balls 18 on the bottom substrate 21.

Figure 4C:
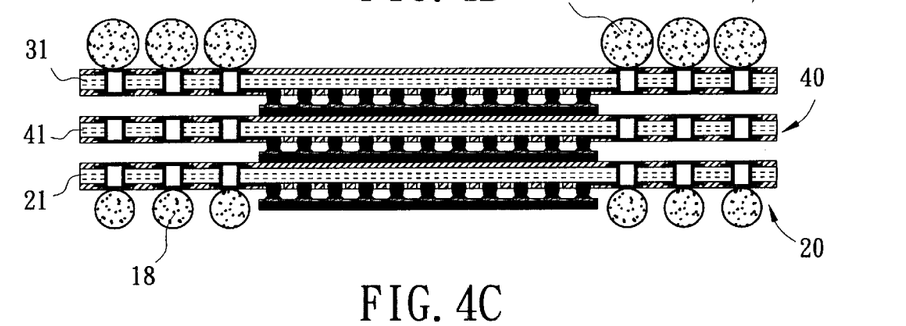
Figure 4D:
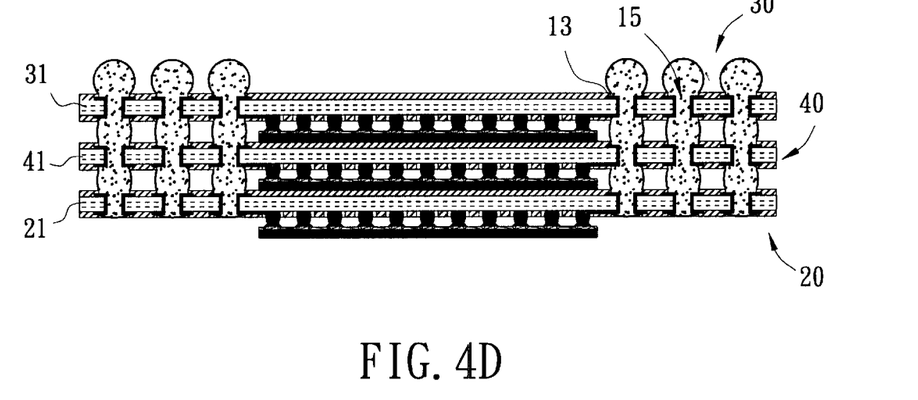

As shown in FIG. 4C, the bottom semiconductor packaging element 20, the middle semiconductor packaging element 40, and the top semiconductor packaging element 30 are aligned and stacked in order. In particular, each substrate surface in the stack structure can be coated with the soldering flux on the I/O pads, if necessary. As shown in FIG. 4D, the stacked semiconductor packaging elements 20, 30, 40 is performed with a reflow process so that the solder balls 18, 19 are conducted into the via holes 15 of the I/O pads 13 after being melted. After the solder balls 19 on the top substrate 31 are melted, the soldering material flows through each of the substrates 31, 41, 21, achieving the electrical and physical connections among the substrates.

Figure 9A:
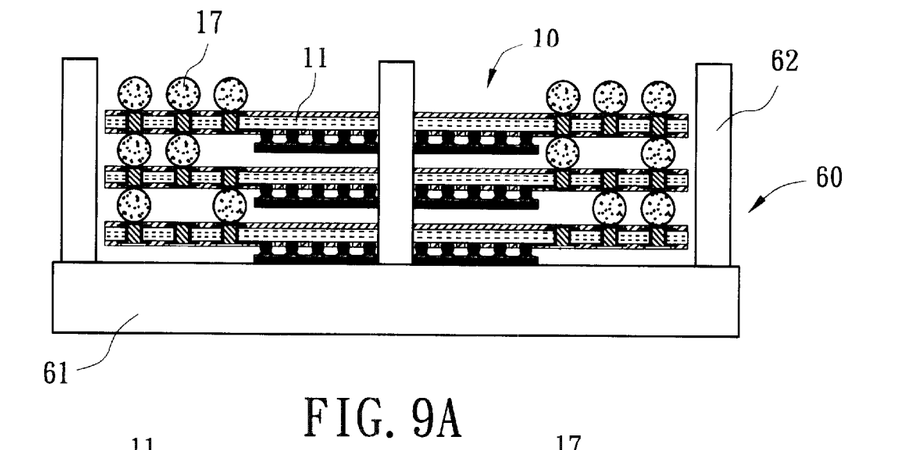
FIGS. 9A and 9B show that the semiconductor packaging elements are aligned and stacked in a fixed frame before the reflow step.
Figure 9B:
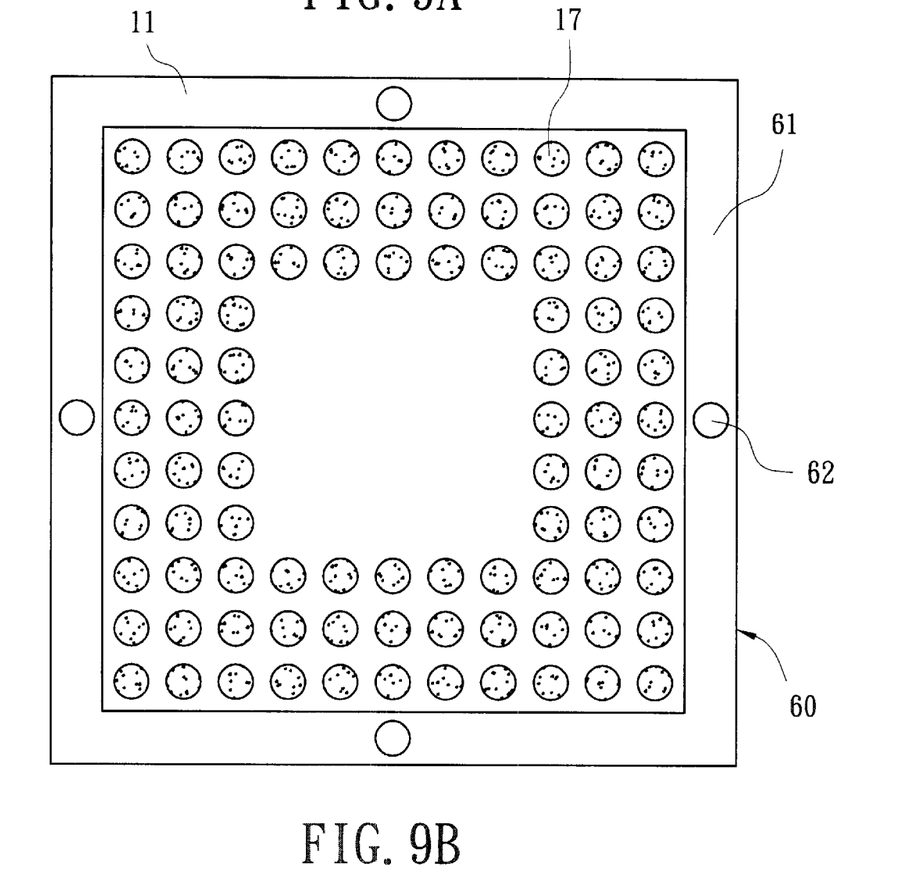

In the above-mentioned embodiments, the step of aligning and stacking the semiconductor packaging elements can be performed in accordance with FIGS. 9A and 9B. The semiconductor packaging elements 10 are aligned and stacked in a fixed frame 60. The fixed frame 60 includes a base 61 to support the semiconductor packaging elements 10 and four fixed pods 62 standing at the four corners of the base 61 to limit the horizontal motion of the substrates 11 of the semiconductor packaging elements 10. Through this, the relative positions of the stacked semiconductor packaging elements 10 are not able to vary too much before the reflow. During the reflow process, this can further help the self-alignment effect among the semiconductor packaging elements 10.

Figure 5:
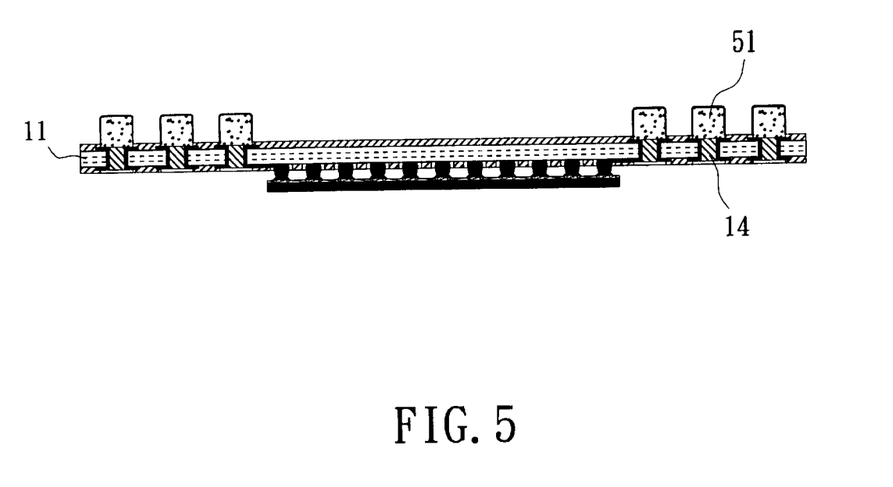
FIG. 5 shows that solder paste is coated on the I/O pad on the top surface of a semiconductor packaging element by printing, the I/O pad having filled via holes.
Figure 6:
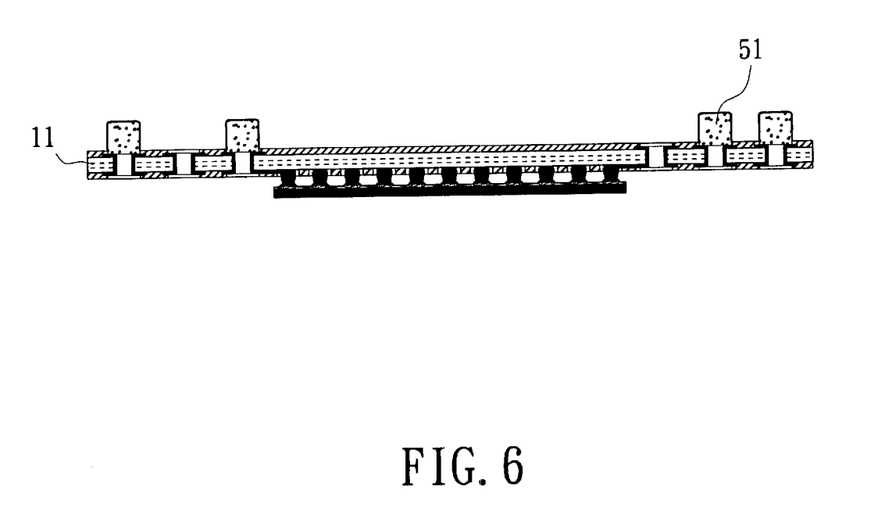
FIG. 6 shows that solder paste is coated on the I/O pad on the top surface of a semiconductor packaging element by printing, the I/O pad having via holes.

In the previously mentioned embodiments, the step of coating the soldering flux on the I/O pads and the step of disposing solder balls on the I/O pads can be replaced by the step of coating solder paste. For example, as shown in FIG. 5 or FIG. 6, the solder paste can be applied on the substrate 11 by printing.

Figure 7:
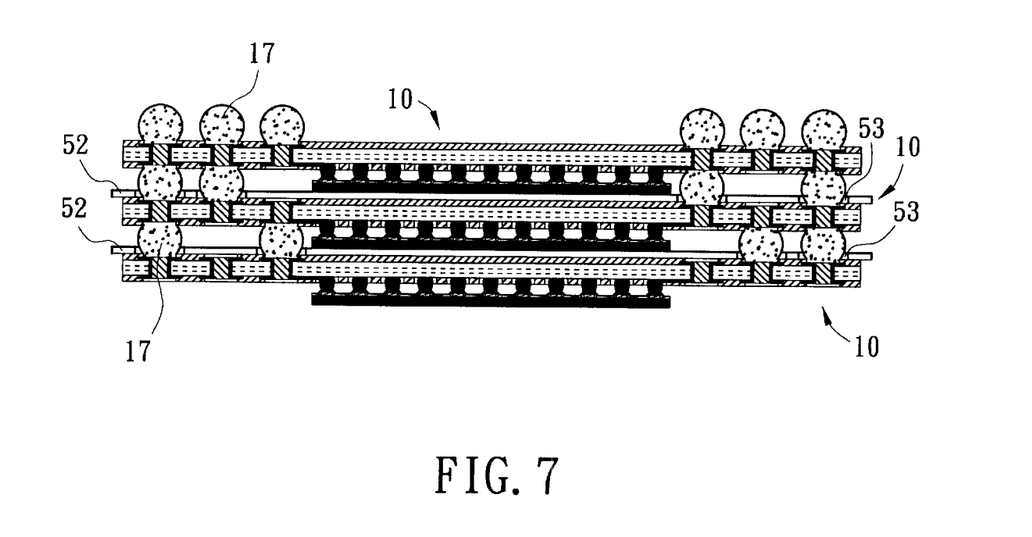
FIG. 7 shows that heat dispersion plates are provided between stacked semiconductor packaging elements.

The above-mentioned embodiments can further include the step of disposing heat dispersion plates 52 between the semiconductor packaging elements 10, as shown in FIG. 7. The heat dispersion plate 52 can be made of, for example, ceramic material with good heat conductivity. It is also formed with proper holes 53 for the solder balls 17 to pass through.

Figure 8A:
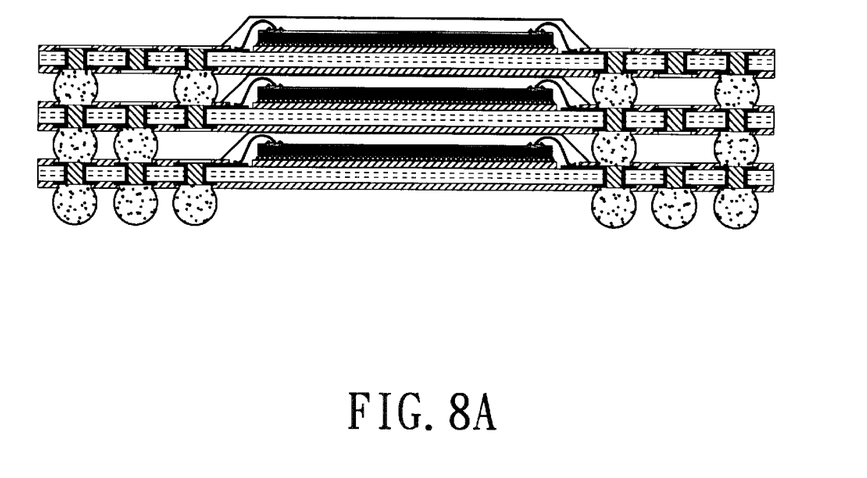
FIG. 8A shows that the stacked semiconductor packaging elements are wire connected.
Figure 8B:
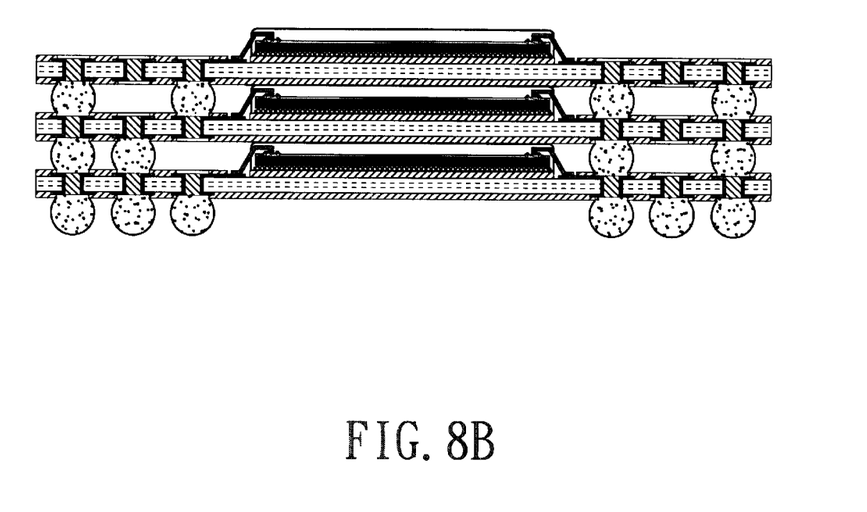
FIG. 8B shows that the stacked semiconductor packaging elements are scroll tape connected.

Besides the elements packaged by flip-chip bonding method, the semiconductor packaging elements in the above-mentioned embodiments can be elements packaged in other forms. For example, the one shown in FIG. 8A is a semiconductor packaging element formed by wire bonding; the one shown in FIG. 8B is a semiconductor packaging element formed by tape bonding.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A one-step semiconductor stack packaging method, which comprises:
   providing a plurality of semiconductor packaging elements, each of the semiconductor packaging elements including a substrate and at least one chip, the substrate having an upper surface and a lower surface, the chip being installed on the lower surface of the substrate, a layout of wires and I/O pads being disposed on the substrate, each of the I/O pads- of at least one of the substrates having a via through hole, that is free of a filling material and that extends through the substrate;
   coating a soldering flux on the I/O pads on the upper surface of each of the substrates;
   disposing soldering balls on the I/O pads on the upper surface of each of the substrates;
   aligning and stacking the plurality of semiconductor packaging elements; and
   reflowing the stacked semiconductor packaging elements, causing the solder balls to melt and flow through and fill the via through holes, thereby achieving electrical connections among the substrates.

2. The method of claim 1, wherein none of the via through holes of any of the substrates are provided with a filling material.

3. The method of claim 1, wherein each of the I/O pads on all the substrates except for the top substrate has a via through hole that is free of the filling material.

4. The method of claim 1, wherein the chip is installed on the substrate by flip-chip bonding method.

5. The method of claim 1, wherein the chip is installed on the substrate by tape bonding.

6. The method of claim 1, wherein the chip is installed on the substrate by wire bonding.

7. The method of claim 1, wherein the substrate is a flexible substrate.

8. The method of claim 1, wherein the substrate is a rigid substrate.

9. The method of claim 1, wherein the substrate is a single-layer board.

10. The method of claim 1. wherein the substrate is a multi-layer board.

11. The method of claim 1, further comprising disposing heat dispersion plates between the semiconductor packaging elements.

12. The method of claim 1, wherein the via holes of a top substrate are filled with a filling material, and the via through holes of all other substrates are free of the filling material.

13. A one-step semiconductor stack packaging method, which comprises:
    providing a plurality of semiconductor packaging elements, each of the semiconductor packaging elements including a substrate and at least one chip, the substrate having an upper surface and a lower surface, the chip being installed on the lower surface of the substrate, and a layout of wires and proper I/O pads being disposed on the substrate, each of the I/O pads of at least one of the substrates having a via through hole that is free of a filling material and that extends through the substrate;
    coating solder paste on the I/O pads on the upper surface of each of the substrates;
    aligning and stacking the plurality of semiconductor packaging elements; and
    reflowing the stacked semiconductor packaging elements, causing the solder paste to melt and flow through and fill the via through holes, thereby achieving electrical connections among the substrates.

14. The method of claim 13, wherein the step of coating solder paste on the I/O pads on the upper surface of the substrate is achieved by printing.

15. The method of claim 13, wherein each of the I/O pads on all the substrates except for the top substrate has a via through hole that is free of the filling material.

16. The method of claim 13, wherein the chip is installed on the substrate by flip-chip bonding method.

17. The method of claim 13, wherein the chip is installed on the substrate by tape bonding.

18. The method of claim 13, wherein the chip is installed on the substrate by wire bonding.

19. The method of claim 13, wherein the substrate is a flexible substrate.

20. The method of claim 13, wherein the substrate is a rigid substrate.

21. The method of claim 13, wherein the substrate is a single-layer plate.

22. The method of claim 13, wherein the substrate is a multi-layer board.

23. The method of claim 13, further comprising disposing heat dispersion plates between the semiconductor packaging elements.

24. The method of claim 13, wherein none of the via through holes of any of the substrates are provided with a filling material.

25. The method of claim 13, wherein the via holes of a top substrate are filled with a filling material, and the via through holes of all other substrates are free of the filling material.

26. A one-step semiconductor stack packaging method, which comprises the steps of:
    providing a top semiconductor packaging element, a bottom semiconductor packaging element, and a middle semiconductor packaging element, each of the semiconductor packaging elements consisting of a substrate and at least one chip, the substrate having an upper surface and a lower surface, the chip being installed on the lower surface of the substrate, a layout of wires and proper I/O pads is prepared in advance on the substrate, and each of the I/O pads having a via hole;
    coating a soldering flux on the I/O pads of the upper surface of the substrate of the top semiconductor packaging element;

disposing solder balls on the I/O pads on the upper surface of the substrate of the top semiconductor packaging element;

coating a soldering flux on the I/O pads of the lower surface of the substrate of the bottom semiconductor packaging element;

disposing solder balls on the I/O pads on the lower surface of the substrate of the bottom semiconductor packaging element;

aligning and stacking the plurality of semiconductor packaging elements; and reflowing the stacked semiconductor packaging elements so that the soldering material permeates through all substrates, achieving electrical connections among the substrates.

27. The method of claim 26, wherein the chip is installed on the substrate by flip-chip bonding method.

28. The method of claim 26, wherein the chip is installed on the substrate by tape bonding.

29. The method of claim 26, wherein the chip is installed on the substrate by wire bonding.

30. The method of claim 26, wherein the substrate is a flexible substrate.

31. The method of claim 26, wherein the substrate is a rigid substrate.

32. The method of claim 26, wherein the substrate is a single-layer board.

33. The method of claim 26, wherein the substrate is a multi-layer board.

34. The method of claim 26, further comprising the step of disposing heat dispersion plates between the semiconductor packaging elements.

35. The method of claim 26, further comprising the step of coating a soldering flux on the top surface of the substrate of the middle semiconductor packaging element.

36. A one-step semiconductor stack packaging method, which comprises the steps of:

providing a top semiconductor packaging element, a bottom semiconductor packaging element, and a middle semiconductor packaging element, each of the semiconductor packaging elements consisting of a substrate and at least one chip, the substrate having an upper surface and a lower surface, the chip being installed on the lower surface of the substrate, a layout of wires and proper I/O pads is prepared in advance on the substrate, and each of the I/O pads having a via hole;

coating solder paste on the I/O pads on the upper surface of the substrate of the top semiconductor packaging element;

coating solder paste on the I/O pads on the bottom surface of the substrate of the bottom semiconductor packaging element;

aligning and stacking the plurality of semiconductor packaging elements; and reflowing the stacked semiconductor packaging elements so that the soldering material permeates through all substrates, achieving electrical connections among the substrates.

37. The method of claim 36, wherein the step of coating solder paste on the I/O pads is achieved by printing.

38. The method of claim 36, wherein the chip is installed on the substrate by flip-chip bonding method.

39. The method of claim 36, wherein the chip is installed on the substrate by tape bonding.

40. The method of claim 36, wherein the chip is installed on the substrate by wire bonding.

41. The method of claim 36, wherein the substrate is a flexible substrate.

42. The method of claim 36, wherein the substrate is a rigid substrate.

43. The method of claim 36, wherein the substrate is a single-layer board.

44. The method of claim 36, wherein the substrate is a multi-layer board.

45. The method of claim 36 further comprising the step of disposing heat dispersion plates between the semiconductor packaging elements.

46. The method of claim 36 further comprising the step of coating a soldering flux on the top surface of the substrate of the middle semiconductor packaging element.

* * * * *